United States Patent
Dellock et al.

(10) Patent No.: US 11,240,944 B2
(45) Date of Patent: Feb. 1, 2022

(54) REAR METHOD OF HEAT SINKING SCREENS AND ELECTRONICS IN ENCLOSED AREAS

(71) Applicant: Ford Global Technologies, LLC, Dearborn, MI (US)

(72) Inventors: Paul Kenneth Dellock, Northville, MI (US); Cornel Lewis Gardner, Romulus, MI (US); Stuart C. Salter, White Lake, MI (US); David Brian Glickman, Southfield, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 64 days.

(21) Appl. No.: 16/513,125

(22) Filed: Jul. 16, 2019

(65) Prior Publication Data

US 2021/0022274 A1  Jan. 21, 2021

(51) Int. Cl.
*H05K 7/20* (2006.01)

(52) U.S. Cl.
CPC ..... *H05K 7/20963* (2013.01); *H05K 7/20854* (2013.01)

(58) Field of Classification Search
CPC ........ H05K 7/1432; H05K 7/20845–7/20854; H05K 7/2089; H05K 7/209; H05K 7/20963; H01H 13/70–88; H01L 23/36–427; B60R 25/23; B62D 25/04; E05B 81/76; H03K 17/9622; H03K 17/955; H03K 2217/960705; E05Y 2400/86; B29K 2021/003–006
See application file for complete search history.

(56) References Cited

U.S. PATENT DOCUMENTS

| | | | |
|---|---|---|---|
| 6,441,943 B1* | 8/2002 | Roberts | B60R 1/1207 359/267 |
| 10,470,321 B1* | 11/2019 | Davis | H05K 7/20963 |
| 2007/0081344 A1* | 4/2007 | Cappaert | G02B 6/0085 362/373 |
| 2011/0170253 A1* | 7/2011 | Liu | G06F 3/0428 361/679.22 |
| 2017/0335606 A1* | 11/2017 | Schatz | H05K 7/20963 |
| 2018/0297513 A1* | 10/2018 | Salter | B60Q 3/82 |
| 2018/0302088 A1* | 10/2018 | Majkowski | B60Q 3/82 |
| 2019/0213931 A1* | 7/2019 | Brubaker | B60Q 1/44 |
| 2019/0329701 A1* | 10/2019 | Garcia Garcia | B60Q 1/2653 |
| 2019/0373773 A1* | 12/2019 | Bougher | B29C 64/106 |
| 2020/0083886 A1* | 3/2020 | Vemulapati | H03K 17/955 |

(Continued)

FOREIGN PATENT DOCUMENTS

| | | |
|---|---|---|
| CN | 201228893 Y | 4/2009 |
| CN | 204166832 U | 2/2015 |

(Continued)

*Primary Examiner* — Zachary Pape
*Assistant Examiner* — Amir A Jalali
(74) *Attorney, Agent, or Firm* — David Coppiellie; Carlson, Gaskey & Olds, P.C.

(57) ABSTRACT

An apparatus includes a screen configured to be positioned on a vehicle exterior and a housing associated with the screen. The housing is comprised of a first material that is electrically conductive and thermally conductive and a second material is positioned to extend between an exterior surface of the housing and a vehicle structure, wherein the second material is thermally conductive.

20 Claims, 2 Drawing Sheets

(56) References Cited

U.S. PATENT DOCUMENTS

2020/0174625 A1* 6/2020 Lin .................. G06F 3/0443
2021/0225777 A1* 7/2021 Bolotov ............. H01L 23/00

FOREIGN PATENT DOCUMENTS

| CN | 204577004 U | | 8/2015 |
|---|---|---|---|
| CN | 106023806 A | | 10/2016 |
| CN | 206024371 U | | 3/2017 |
| EP | WO-2009/043849 | * | 4/2009 |

* cited by examiner

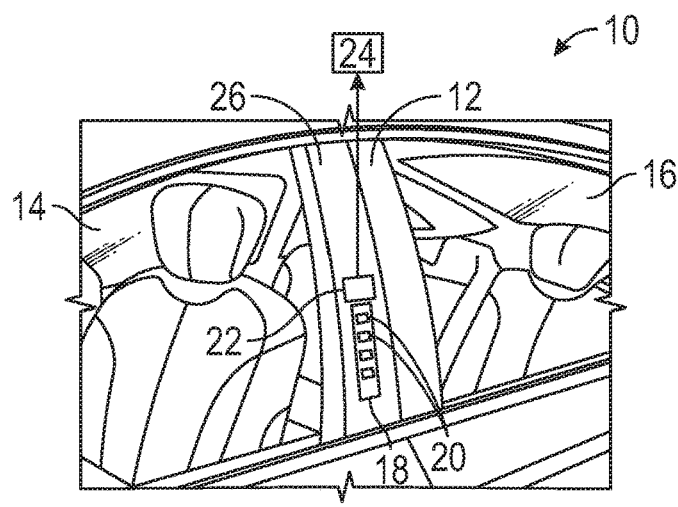
FIG. 1
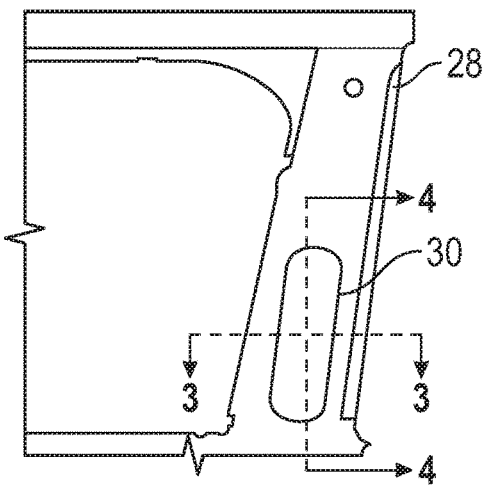
FIG. 2
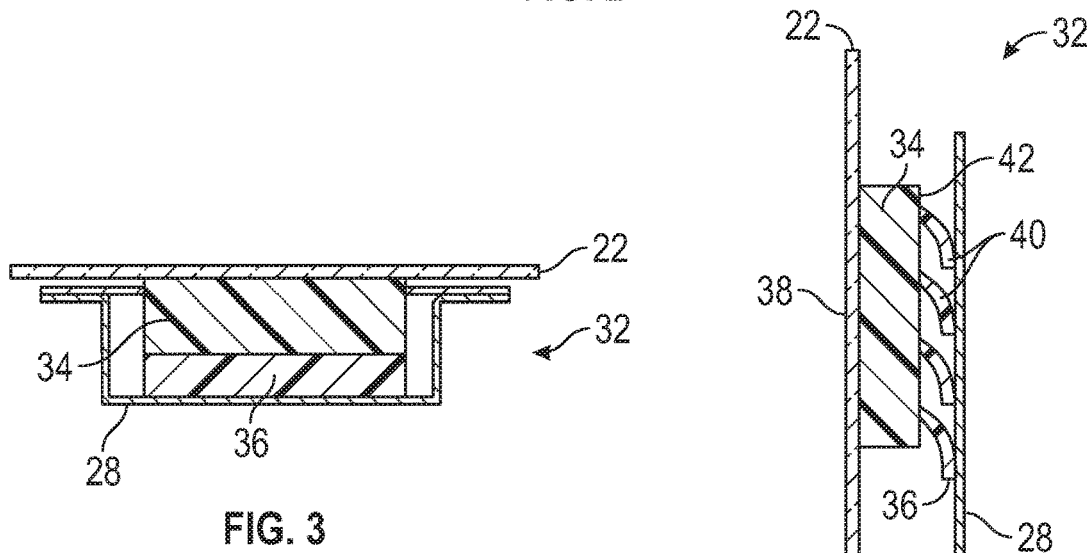
FIG. 3
FIG. 4

REAR METHOD OF HEAT SINKING SCREENS AND ELECTRONICS IN ENCLOSED AREAS

TECHNICAL FIELD

This disclosure relates generally to a method and apparatus for heat sinking screens and electronics in enclosed areas.

BACKGROUND

Vehicles can include exterior surfaces that incorporate display and/or data entry screens. These screens have a high level of brightness such that the screens can be easily seen in sunlight. As such, the screens generate heat that needs to be efficiently transferred to other vehicle areas.

SUMMARY

An apparatus according to an exemplary aspect of the present disclosure includes, among other things, a screen configured to be positioned on a vehicle exterior and a housing associated with the screen. The housing is comprised of a first material that is electrically conductive and thermally conductive and a second material is positioned to extend between an exterior surface of the housing and a vehicle structure, wherein the second material is thermally conductive.

In a further non-limiting embodiment of the foregoing apparatus, the second material is softer than the first material.

In a further non-limiting embodiment of any of the foregoing apparatus, the second material comprises a thermoplastic elastomer.

In a further non-limiting embodiment of any of the foregoing apparatus, a plurality of cooling fins is formed from the second material.

In a further non-limiting embodiment of any of the foregoing apparatus, the first material comprises polypropylene with graphite and/or graphene.

In a further non-limiting embodiment of any of the foregoing apparatus, the cooling fins are resilient and bendable.

In a further non-limiting embodiment of any of the foregoing apparatus, the screen comprises a display and/or data entry screen.

In a further non-limiting embodiment of any of the foregoing apparatus, the vehicle exterior comprises a pillar.

In a further non-limiting embodiment of any of the foregoing apparatus, the vehicle structure comprises an inner sheet metal structure.

An apparatus, according to yet another exemplary aspect of the present disclosure includes, among other things, an inner sheet metal structure, an exterior vehicle surface facing away from the inner sheet metal structure, a screen positioned on the vehicle exterior surface, and a housing associated with the screen. The housing is comprised of a first material that is electrically conductive and thermally conductive, and a plurality of cooling fins are formed from a second material and extend between an exterior surface of the housing and the inner sheet metal structure, wherein the second material is thermally conductive.

In a further non-limiting embodiment of any of the foregoing apparatus, the screen comprises a display and/or data entry screen that is connected to a printed circuit board located within the housing, and including at least one touch sensor associated with the screen and connected to the printed circuit board.

In a further non-limiting embodiment of any of the foregoing apparatus, the first material comprises polypropylene having a first percentage of graphite and/or graphene.

In a further non-limiting embodiment of any of the foregoing apparatus, the second material comprises a thermoplastic elastomer having a second percentage of graphite and/or graphene, and wherein the second percentage is less than the first percentage.

In a further non-limiting embodiment of any of the foregoing apparatus, the vehicle exterior comprises a pillar.

In a further non-limiting embodiment of any of the foregoing apparatus, the cooling fins are resilient and bendable.

A method according to still another exemplary aspect of the present disclosure includes, among other things, molding a housing from a first material that is electrically conductive and thermally conductive; molding a plurality of cooling fins of a second material on an exterior surface of the housing, wherein the second material is thermally conductive; positioning a display and/or data entry screen in the housing; mounting the housing to a vehicle exterior surface such that the display and/or data entry screen faces vehicle exterior surroundings; and positioning the plurality of cooling fins to extend from the exterior surface of the housing toward an inner sheet metal structure.

In a further non-limiting embodiment of the foregoing method, the housing is made from a two-shot injection molding process with the first material being shot first and the second material being shot subsequent to the first material.

In a further non-limiting embodiment of any of the foregoing methods, the first material comprises polypropylene having a first percentage of graphite and/or graphene, and wherein the second material comprises a thermoplastic elastomer having a second percentage of graphite and/or graphene that is less than the first percentage.

In a further non-limiting embodiment of any of the foregoing methods, the method includes connecting the display and/or data entry screen to a printed circuit board located within the housing, and including associating at least one touch sensor with the display and/or data entry screen and connecting the display and/or data entry screen to the printed circuit board.

In a further non-limiting embodiment of any of the foregoing methods, the vehicle exterior surface comprises a pillar.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE DRAWINGS

The various features and advantages of the disclosed examples will become apparent to those skilled in the art from the detailed description. The figures that accompany the detailed description can be briefly described as follows:

FIG. 1 illustrates a vehicle exterior incorporating a screen.

FIG. 2 illustrates a vehicle inner structure for a pillar.

FIG. 3 shows a cross-section of the inner vehicle structure taken along 3-3 as shown in FIG. 2.

FIG. 4 shows a cross-section of the inner vehicle structure taken along 4-4 as shown in FIG. 2.

DETAILED DESCRIPTION

Figure 5:
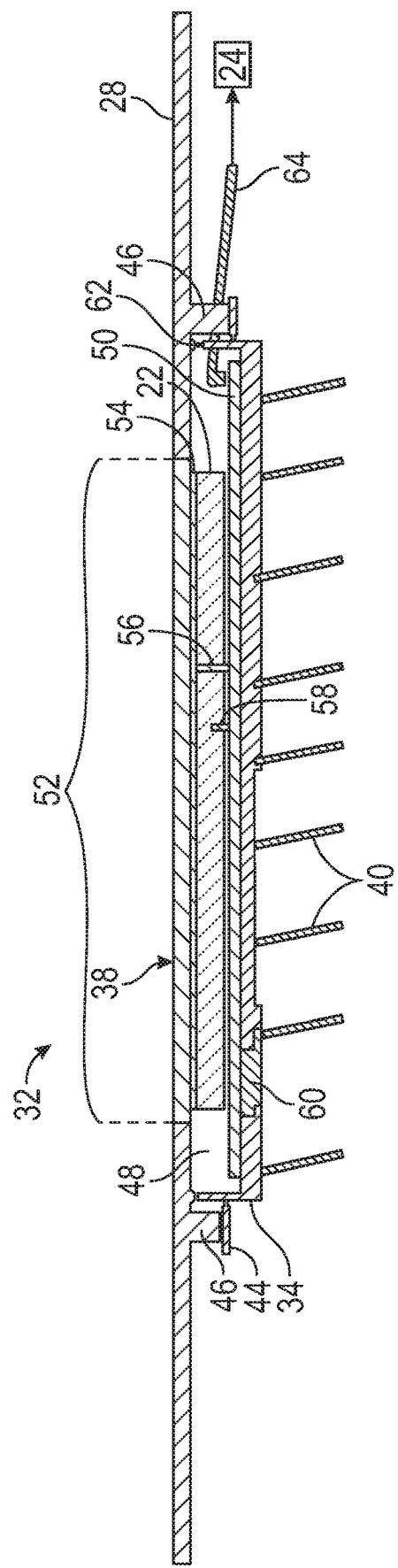
FIG. 5 is a section view of a screen module as installed in the inner vehicle structure.

This disclosure details exemplary apparatus and methods for heat sinking screens and electronics in enclosed areas. These and other features are discussed in greater detail in the following paragraphs of this detailed description.

FIG. 1 shows a vehicle 10 that includes a B-pillar 12 that is positioned between a driver side front window 14 and a driver side rear window 16. The B-pillar 12 includes a display and/or input device 18, such as a keyless entry keypad for example. The device 18 includes one or more actuation members 20 to enter data, such as buttons, pads, switches, etc., for example, and/or a display screen 22. The display screen 22 can be used to display information and/or can be used as a touch screen to communicate input data to a vehicle control module 24. Further, while the screen 22 is shown in the example of FIG. 1 as being mounted to a B-pillar 12, the screen 22 could be mounted to other pillars or vehicle external panels or surfaces.

In one example, the screen 22 comprises a high power liquid crystal display (LCD) screen that is mounted on a vehicle exterior 26. The screen 22 can be used as a keyless entry system and/or can be used as a display and entry screen for autonomous and rideshare vehicles. These LCD screens often have a brightness of well over 1000 nits (cd/m$^2$) so that the screens are easily visible in bright sunlight. The bright screens generate a significant amount of heat and are often packaged in closed sections of a vehicle, such as pillars for example, where there is little airflow available to cool the screen.

FIG. 2 shows an example of an inner vehicle structure 28 with an enclosed area that is located at a pillar. In one example, the inner vehicle structure 28 is comprised of sheet metal made from steel or aluminum, for example. FIG. 3 shows a cross-section of the inner vehicle structure 28 taken along A-A as shown in FIG. 2. FIG. 4 shows a cross-section of the inner vehicle structure 28 taken along B-B as shown in FIG. 2. The inner vehicle structure 28 includes an opening 30 (FIG. 2) that receives a module 32 for the screen 22.

As shown in FIG. 3, the module 32 transfers heat from the LCD screen 22 directly to the surrounding sheet metal of the inner vehicle structure 28. As such, the door sheet metal serves as a heat sink to cool the module 32. This is accomplished by forming a screen housing 34 out of a thermally conductive material. Additionally, it is important to shield the module electronics from electromagnetic interference (EMI) so the housing material is also electrically conductive. A thermally conductive soft material 36 is used to transfer the heat from the housing 34 to the sheet metal. This soft material 36 will contact the sheet metal and transfer the heat from housing 34 to the sheet metal, which serves as a heat sink.

As shown in FIG. 4, the screen 22 is located within the housing 34 and a LCD applique 38 is applied over the screen 22 to provide an exterior surface of the module 32. A plurality of cooling fins 40 are formed from the second material and extend from an exterior surface 42 of the housing 34 to the inner vehicle structure 28. The fins 40 are resilient and bendable to absorb any vibrations between the housing 34 and sheet metal structure 28.

In one example, the housing 34 is formed from a hard plastic material and the material 36 of the cooling fins 40 comprises a softer plastic material. The use of the softer material 36 between the housing 34 and the inner vehicle structure 28 reduces the occurrence of rattling noises. In one example, the housing 34 is comprised of a polypropylene (PP) material. As known, polymers are inherently thermally insulating with conductivity less than 0.5 W/m·K. To increase the thermal conductivity of the housing 34, conductive fillers such as specialty graphite, e.g. TIMREX®, C-THERM®, etc, are added to the PP material. For example, adding approximately 40% of such a conductive filler to PP can increase thermal conductivity to 15 W/m·K, which is equivalent to stainless steel. Another example of a conductive filler that can be added to PP is graphene, the addition of which can be used to increase the thermal conductivity and can be substituted or combined with the graphite.

A resistivity of approximately $10^3$ ohm/sq would be needed to efficiently shield the module electronics from electromagnetic interference. Polymers have a resistivity above $10^{12}$ ohm/sq. Adding graphene or graphite in the quantities exemplified above will reduce the resistivity to about $10^1$ ohm/sq. As such, a housing 34 formed from the PP material with conductive fillers as described above will be effective at EMI shielding.

In one example, the material 36 for the cooling fins 40 comprises a soft thermoplastic elastomer (TPE). An example of a soft TPE material is Monprene CP-10130 from Teknor Apex which has a Shore A harness of 30. Added to this soft TPE material is approximately 10% graphene or specialty graphite, which increases the thermal conductivity to roughly 5 W/m·K while increasing the Shore A hardness to about 80-90. To further improve conductivity, a chemical foaming agent, such as Foamazol™ 62 from Bergen chemicals, Hydrocerolt™ from Clariant, or other foaming agents that emit either nitrogen or carbon dioxide gas for example, can be added which randomizes the orientation of the graphite/graphene platelets and increases the thermal conductivity to 8 W/m·K. This is 30 times more conductive than air (0.027 W/m·K).

In one example, the housing 34 is made using a two-shot injection molding process. The hard conductively modified PP material for the housing 34 is shot first. The softer TPE material for the cooling fins 40 is the second shot. Thus, the housing 34 and fins 40 are molded together to provide a single or one-piece unit.

FIG. 5 shows one example configuration of the housing 34 being mounted to the inner vehicle structure 28. In this example, the housing 34 includes a peripheral flange 44 that includes openings for fasteners 46. The fasteners 46, such as screws for example, fix the housing 34 to the inner vehicle structure 28. The housing defines an internal cavity 48 that receives the screen 22 and a printed circuit board (PCB) 50. The LCD applique 38, which can include a touch sensor 52, is positioned over the screen 22. In one example, the applique 38, comprises a polymethylmetacrylate (PMMA) acrylic/foil, or a polycarbonate (PC) and/or ABS (Acrylonitrile-Butadiene-Styrene) material. The touch sensor 52 is bonded to the screen with a layer of adhesive 54. The touch sensor 52 is connected to the PCB 50 via an electrical connection 56 and the PCB 50 is connected to the screen via a cable 58 or other similar connection.

The housing 34 can include a vent 60 to the exterior surface 42 of the housing 34. There is also sealing 62, such as adhesive for example, all around the opening in the sheet metal between the vehicle inner structure 28 and the housing 34. A pigtail cable 64 is used to connect the PCB 50 to a wiring harness or other structure that can communicate with the control module 24.

The housing 34 made from the material configuration described above efficiently removes heat from the screen 22. The flexible cooling fins 40 are also thermally conductive and mate to the surrounding sheet metal of the inner vehicle structure 28 to efficiently transfer heat to the sheet metal resulting in the creation of a large heat sink. Further, the housing material is also electrically conductive to effectively shield the module 32 from EMI. The subject configuration is a lower cost and weight solution as compared to adding a separate cooling fan for the module 32.

Although a specific component relationship is illustrated in the figures of this disclosure, the illustrations are not intended to limit this disclosure. In other words, the placement and orientation of the various components shown could vary within the scope of this disclosure. In addition, the various figures accompanying this disclosure are not necessarily to scale, and some features may be exaggerated or minimized to show certain details of a particular component.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. An apparatus, comprising:
a screen configured to be positioned on a vehicle exterior;
a housing associated with the screen, wherein the housing is comprised of a first material that is electrically conductive and thermally conductive, and a second material positioned to extend between an exterior surface of the housing and a vehicle structure, wherein the second material is a thermally conductive plastic material that includes a conductive filler; wherein the first material comprises a plastic material with a conductive filler; and wherein the conductive filler of the first material comprises a first percentage and the conductive filler of the second material comprises a second percentage that is less than the first percentage.

2. The apparatus according to claim 1, wherein the second material is softer than the first material.

3. The apparatus according to claim 1, wherein the second material comprises a thermoplastic elastomer.

4. The apparatus according to claim 3, including a plurality of cooling fins formed from the second material.

5. The apparatus according to claim 4, wherein the first material comprises polypropylene with graphite and/or graphene.

6. The apparatus according to claim 5, wherein the cooling fins are resilient and bendable.

7. The apparatus according to claim 1, wherein the screen comprises a display and/or data entry screen.

8. The apparatus according to claim 1, wherein the vehicle exterior comprises a pillar.

9. The apparatus according to claim 1, wherein the vehicle structure comprises an inner sheet metal structure.

10. An apparatus, comprising:
an inner sheet metal structure;
an exterior vehicle surface facing away from the inner sheet metal structure;
a screen positioned on the vehicle exterior surface;
a housing associated with the screen, wherein the housing is comprised of a first material that is electrically conductive and thermally conductive, and wherein the first material comprises a plastic material with a conductive filler; and
a plurality of cooling fins formed from a second material and which extend between an exterior surface of the housing and the inner sheet metal structure, wherein the second material is a thermally conductive plastic material that includes a conductive filler, and wherein the conductive filler of the first material comprises a first percentage and the conductive filler of the second material comprises a second percentage that is less than the first percentage.

11. The apparatus according to claim 10, wherein the screen comprises a display and/or data entry screen that is connected to a printed circuit board located within the housing, and including at least one touch sensor associated with the screen and connected to the printed circuit board.

12. The apparatus according to claim 10, wherein the first material comprises polypropylene having a first percentage of graphite and/or graphene.

13. The apparatus according to claim 10, wherein the vehicle exterior comprises a pillar.

14. The apparatus according to claim 13, wherein the cooling fins are resilient and bendable.

15. An apparatus, comprising: an inner sheet metal structure; an exterior vehicle surface facing away from the inner sheet metal structure; a screen positioned on the vehicle exterior surface; a housing associated with the screen, wherein the housing is comprised of a first material that is electrically conductive and thermally conductive, and wherein the first material comprises polypropylene having a first percentage of graphite and/or graphene; and a plurality of cooling fins formed from a second material and which extend between an exterior surface of the housing and the inner sheet metal structure, wherein the second material is a thermally conductive plastic material that includes a conductive filler, and wherein the thermally conductive plastic material comprises a thermoplastic elastomer and wherein the conductive filler comprises graphite and/or graphene, and wherein the second material has a second percentage of graphite and/or graphene, and wherein the second percentage is less than the first percentage.

16. A method comprising:
molding a housing from a first material that is electrically conductive and thermally conductive;
molding a plurality of cooling fins of a second material on an exterior surface of the housing, wherein the second material is a thermally conductive plastic material that includes a conductive filler, and wherein the first material comprises a plastic material with a conductive filler, and wherein the conductive filler has a greater percentage in the first material than a percentage of the conductive filler in the second material;
positioning a display and/or data entry screen in the housing;
mounting the housing to a vehicle exterior surface such that the display and/or data entry screen faces vehicle exterior surroundings; and
positioning the plurality of cooling fins to extend from the exterior surface of the housing toward an inner sheet metal structure.

17. The method according to claim 16, wherein the housing is made from a two-shot injection molding process with the first material being shot first and the second material being shot subsequent to the first material.

18. The method according to claim 16, including connecting the display and/or data entry screen to a printed circuit board located within the housing, and including associating at least one touch sensor with the display and/or data entry screen and connecting the display and/or data entry screen to the printed circuit board.

19. The method according to claim 18, wherein the vehicle exterior surface comprises a pillar.

20. A method comprising: molding a housing from a first material that is electrically conductive and thermally conductive; molding a plurality of cooling fins of a second material on an exterior surface of the housing, wherein the second material is a thermally conductive plastic material that includes a conductive filler, and wherein the first material comprises polypropylene having a first percentage of graphite and/or graphene, and wherein the thermally conductive plastic material comprises a thermoplastic elastomer and wherein the conductive filler comprises graphite and/or graphene, and wherein the second material has a second percentage of graphite and/or graphene that is less than the first percentage; forming the housing from a two-shot injection molding process with the first material being shot first and the second material being shot subsequent to the first material; positioning a display and/or data entry screen in the housing; mounting the housing to a vehicle exterior surface such that the display and/or data entry screen faces vehicle exterior surroundings; and positioning the plurality of cooling fins to extend from the exterior surface of the housing toward an inner sheet metal structure.

\* \* \* \* \*